US012255435B2

(12) United States Patent
Yang

(10) Patent No.: US 12,255,435 B2
(45) Date of Patent: Mar. 18, 2025

(54) LASER PROJECTION MODULE AND TERMINAL DEVICE

(71) Applicant: VIVO MOBILE COMMUNICATION CO., LTD., Guangdong (CN)

(72) Inventor: Wanglai Yang, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 780 days.

(21) Appl. No.: 17/513,786

(22) Filed: Oct. 28, 2021

(65) Prior Publication Data

US 2022/0052507 A1    Feb. 17, 2022

Related U.S. Application Data

(63) Continuation of application No. PCT/CN2020/084786, filed on Apr. 14, 2020.

(30) Foreign Application Priority Data

Apr. 29, 2019 (CN) .......................... 201910355256.7

(51) Int. Cl.
*H01S 5/02345* (2021.01)
*H01S 5/0225* (2021.01)
*H01S 5/0236* (2021.01)

(52) U.S. Cl.
CPC ........ *H01S 5/02345* (2021.01); *H01S 5/0225* (2021.01); *H01S 5/0236* (2021.01)

(58) Field of Classification Search
CPC ............................ H01S 5/02255; H01S 5/0236
See application file for complete search history.

(56) References Cited

U.S. PATENT DOCUMENTS

| 6,816,523 | B1 | 11/2004 | Glenn et al. |
| 2017/0353004 | A1* | 12/2017 | Chen .................... H01S 5/02234 |
| 2017/0365632 | A1 | 12/2017 | Tu et al. |

FOREIGN PATENT DOCUMENTS

| CN | 108196418 A | | 6/2018 |
| CN | 108663872 A | | 10/2018 |
| CN | 109379460 A | | 2/2019 |
| CN | 109478767 A | | 3/2019 |
| CN | 109543515 A | | 3/2019 |
| CN | 208569274 | * | 3/2019 |
| CN | 208569274 U | | 3/2019 |
| CN | 109994921 | * | 7/2019 |
| CN | 109994921 A | | 7/2019 |
| EP | 3848850 A1 | | 7/2021 |

(Continued)

OTHER PUBLICATIONS

International Search Report of International Application No. PCT/CN2020/084786 mailed on Jun. 22, 2020.

(Continued)

*Primary Examiner* — Tuan N Nguyen
(74) *Attorney, Agent, or Firm* — IP & T GROUP LLP

(57) ABSTRACT

A laser projection module includes a base, a laser chip, an optical element, and a first conducting wire. The base has an inner cavity and an opening connected to the inner cavity, the laser chip is disposed on a bottom wall that is of the inner cavity and that faces the opening, the optical element is mounted in the opening, a wire layer is disposed on the optical element, and the laser chip, the first conducting wire, and the wire layer are sequentially connected in series.

12 Claims, 3 Drawing Sheets

(56) References Cited

FOREIGN PATENT DOCUMENTS

| EP | 3855710 A1 | | 7/2021 |
|---|---|---|---|
| JP | 2014165450 A | | 9/2014 |
| JP | 2014190823 A | | 10/2014 |
| WO | WO 2018/156412 | * | 8/2018 |

OTHER PUBLICATIONS

Written Opinion of the International Searching Authority of International Application No. PCT/CN2020/084786 mailed on Jun. 22, 2020.
Notification to Grant Patent Right for Invention for CN Patent Application No. 201910355256.7 mailed on Aug. 14, 2020.
First Office Action of Priority Application No. 201910355256.7 mailed on Oct. 30, 2019.
Second Office Action of Priority Application No. 201910355256.7 mailed on Jul. 6, 2020.

* cited by examiner

LASER PROJECTION MODULE AND TERMINAL DEVICE

CROSS-REFERENCE OF RELATED APPLICATIONS

This application is a Bypass Continuation Application of PCT/CN2020/084786, filed on Apr. 14, 2020, which claims priority to Chinese Patent Application No. 201910355256.7 filed on Apr. 29, 2019, which are incorporated herein by reference in their entireties.

TECHNICAL FIELD

The present disclosure relates to the technical field of communication devices, and in particular, to a laser projection module and a terminal device.

BACKGROUND

Terminal devices on the market have more and more functions, and more and more terminal devices adopt 3D recognition technologies, which can recognize faces of users. The core of 3D recognition technologies is to measure depth information, and then combine the depth information with obtained 2D planar image information to obtain a 3D image.

SUMMARY

The present disclosure discloses a laser projection module and terminal device.

A laser projection module is provided, including a base, a laser chip, an optical element, and a first conducting wire, where the base has an inner cavity and an opening connected to the inner cavity, the laser chip is disposed on a bottom wall that is of the inner cavity and that faces the opening, the optical element is mounted in the opening, a wire layer is disposed on the optical element, and the laser chip, the first conducting wire, and the wire layer are sequentially connected in series.

A terminal device is provided, including the foregoing laser projection module.

BRIEF DESCRIPTION OF DRAWINGS

The accompanying drawings illustrated herein are provided to further understand the present disclosure and form a part of the present disclosure. The exemplary embodiments of the present disclosure and the descriptions thereof are used to explain the present disclosure and do not constitute an improper limitation on the present disclosure. In the accompanying drawings.

DESCRIPTION OF REFERENCE NUMERALS IN ACCOMPANYING DRAWING

Figure 1:
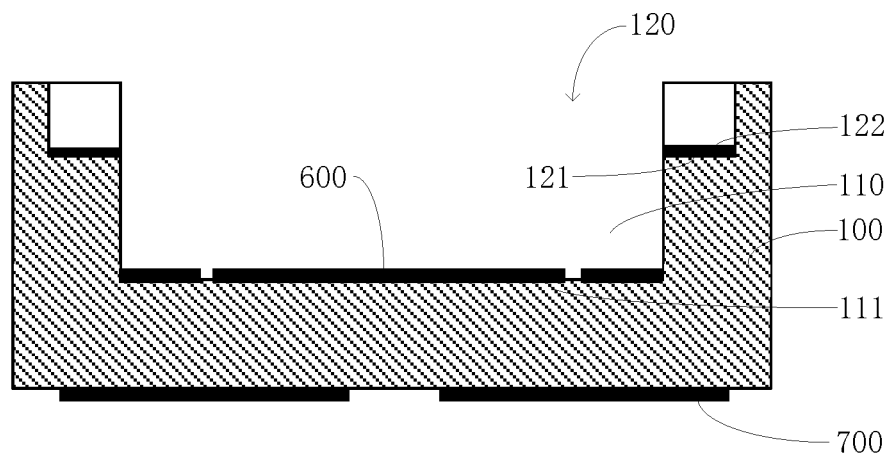
FIG. 1 is a schematic structural diagram of a base of a laser projection module according to some embodiments of the present disclosure.
Figure 2:
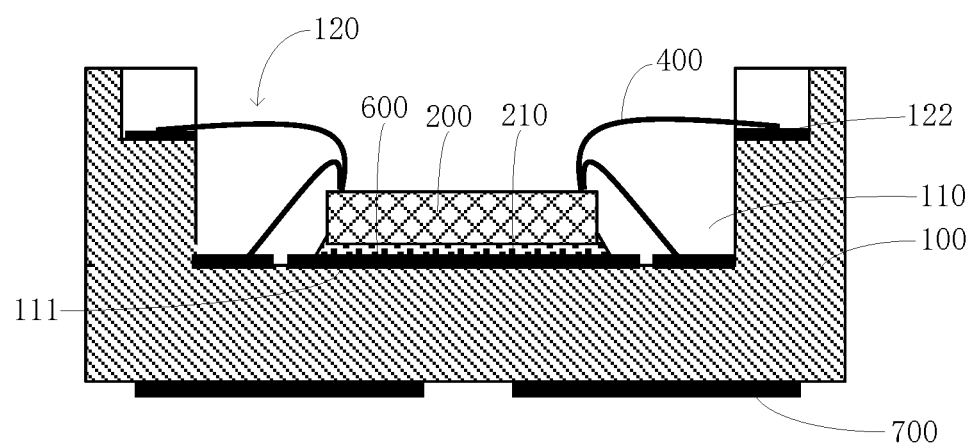
FIG. 2 is a schematic structural diagram of a part of a laser projection module according to some embodiments of the present disclosure.
Figure 3:
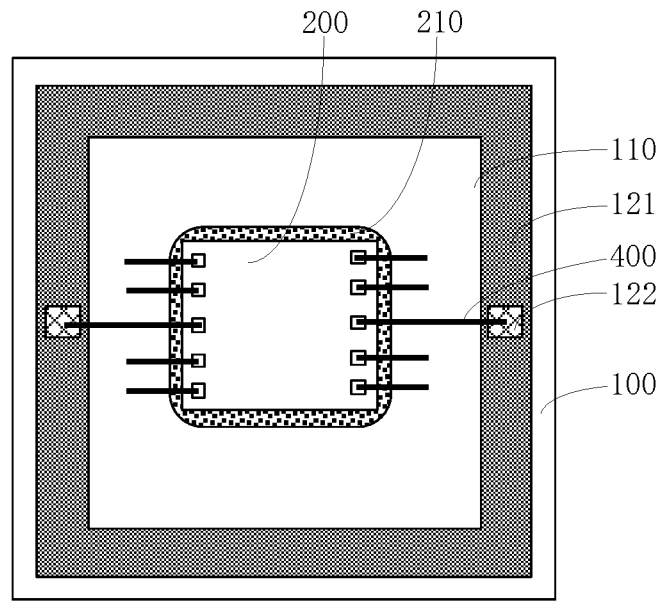
FIG. 3 is a top view of the structure of the part in FIG. 2.
Figure 4:
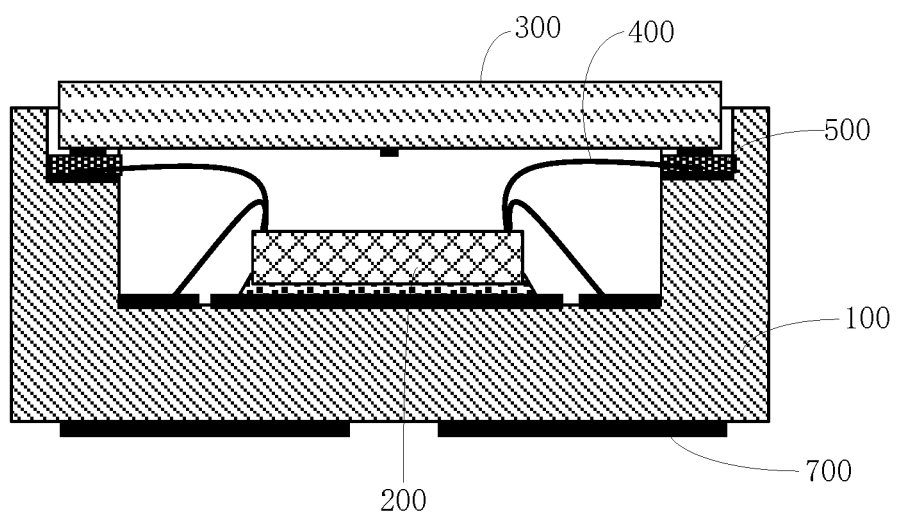
FIG. 4 is a schematic structural diagram of a laser projection module according to some embodiments of the present disclosure.

100—base, 110—inner cavity, 111—bottom wall, 120—opening, 121—step surface, 122—first pad, 200—laser chip, 210—second conductive adhesive layer, 300—optical element, 310—wire layer, 400—first conducting wire, 500—first adhesive connecting portion, 600—second pad, and 700—external electrode.

DETAILED DESCRIPTION OF EMBODIMENTS

To make the objectives, technical solutions, and advantages of the present disclosure clearer, the following clearly describes the technical solutions in the present disclosure with reference to specific embodiments of the present disclosure and the corresponding accompanying drawings. Apparently, the described embodiments are some rather than all of the embodiments of the present disclosure. All other embodiments obtained by a person of ordinary skill in the art based on the embodiments of the present disclosure shall fall within the protection scope of the present disclosure.

At present, 3D recognition technologies include a structured light technology, a time-of-flight ranging technology, a binocular stereoscopic vision technology, and the like. In all the technologies, a light source needs to be projected in a recognition process. Due to advantages of better collimation, better directionality, and higher energy, laser light has become the first choice for light source projection in 3D recognition technologies.

However, because of high energy, laser light harms human body when directly irradiating the skin. Based on this, a laser projection module of a terminal device usually includes an optical element. The optical element diffuses energy of laser light, to avoid harm of human body.

In an actual application process, the terminal device may collide, drop, or the like. As a result, the optical element is easily broken. In this case, the effect of the optical element on laser light disappears and the laser light is directly projected onto the skin. To solve this problem, manufacturers usually mount a connection line on the optical element. The connection line is a part of a power supply loop of the laser transmitter module. When the optical element is broken, the connection line is also broken. Therefore, the power supply loop is broken, and a laser chip therefore stops emitting laser light. This can avoid harm of human body caused by laser light because the optical element is broken.

Usually, a transition line is produced on a side wall of a base of the laser projection module, to form the power supply loop between the connection line on the optical element and the laser chip. However, because the transition line is produced on the side wall of the base, production work is complex. This undoubtedly leads to higher manufacturing costs of the laser projection module.

The technical solutions disclosed in the embodiments of the present disclosure are described in detail with reference to the accompanying drawings.

Referring to FIG. 1 to FIG. 6, some embodiments of the present disclosure disclose a laser projection module. The disclosed laser projection module includes a base 100, a laser chip 200, an optical element 300, and a first conducting wire 400.

The base 100 is a basic component of the laser projection module, and the base 100 can provide basis for mounting other components of the laser projection module. In some embodiments of the present disclosure, both the laser chip 200 and the optical element 300 may be mounted on the base 100. In a mounting process, the base 100 is usually mounted on a circuit board of the terminal device to mount the entire laser projection module. The bottom of the base 100 may be provided with an external electrode 700. The external electrode 700 can be electrically connected to the circuit board, so that the circuit board may supply power to the entire laser projection module.

In some embodiments of the present disclosure, the base 100 has an inner cavity 110 and an opening 120 connected to the inner cavity 110, and the inner cavity 110 has a bottom wall 111 facing the opening 120.

The laser chip 200 is configured to emit laser light, and the laser chip 200 is disposed on the bottom wall 111. The optical element 300 is mounted in the opening 120 to cover the laser chip 200. The optical element 300 is usually a diffusion element. Laser light generated during work of the laser chip 200 may be projected onto the optical element 300 and diffused by the optical element 300, thereby reducing energy of the laser light.

The optical element 300 is provided with a wire layer 310, and the wire layer 310 is a part of a power supply loop that enables the laser chip 200 to work. In some embodiments of the present disclosure, the laser chip 200, the first conducting wire 400, and the wire layer 310 are sequentially connected in series and therefore are used as a part of the power supply loop. In a case that the optical element 300 is broken, the wire layer 310 attached to the optical element 300 is also broken.

The first conducting wire 400 is usually a flexible connection cable. In a connection process, the first conducting wire 400 is usually implemented by using a wire bond technology.

In the laser projection module disclosed in some embodiments of the present disclosure, the laser chip 200 is electrically connected to the wire layer 310 through the first conducting wire 400, and the laser chip 200, the first conducting wire 400, and the wire layer 310 are sequentially connected in series. When the optical element 300 is broken, the wire layer 310 is disconnected, which can disconnect a power supply loop of the laser chip 200 and finally stop the laser chip 200 from continuing to emit laser light, to prevent laser light from harming human body. Compared with related technologies in which the conductive layer is disposed on the side wall of the base, in the laser projection module disclosed in some embodiments of the present disclosure, the first conducting wire 400 may be directly used to connect the laser chip 200 to the wire layer 310. This method does not require complicated processes and helps reduce manufacturing costs of the laser projection module.

In addition, a connection line is usually disposed on the outer side wall of the base, and collision is prone to occur in a mounting process of the laser projection module. Therefore, the connection line is easily damaged. In the laser projection module disclosed in some embodiments the present disclosure, the first conducting wire 400 connecting the wire layer 310 to the laser chip 200 is located in the inner cavity 110, which can avoid circuit damage caused by collision in the mounting process of the laser projection module.

The optical element 300 may be directly fixed on an end surface where the opening 120 is located. To improve stability of mounting, in a more optional solution, the opening 120 of the base 100 may have the step surface 121, and the optical element 300 may be fixedly bonded to the step surface 121. In this case, the optical element 300 is limited by the step surface 121 after being mounted in place, reducing a probability that the optical element 300 falls off.

The first conducting wire 400 may be electrically connected to the wire layer 310 in a variety of manners. In an optional solution, the step surface 121 may be provided with a first pad 122, and the wire layer 310 may be electrically connected to the first conducting wire 400 through the first pad 122.

To improve stability of connection, the first pad 122 and the wire layer 310 may be fixedly glued through a first adhesive connecting portion 500. The first adhesive connecting portion 500 is a first conductive adhesive layer, and the first conductive adhesive layer ensures that the first pad 122 is fixedly connected to the wire layer 310 while the first pad 122 is conductively connected to the wire layer 310.

Certainly, the step surface 121 and an edge of the optical element 300 may be fixedly glued through a second adhesive connecting portion. In this case, the second adhesive connecting portion can help reinforce stability of the connection between the optical element 300 and the step surface 121.

In some embodiments of the present disclosure, the bottom wall 111 of the inner cavity 110 may be provided with a second pad 600. The laser chip 200 may be fixed on the second pad 600, the laser chip 200 is electrically connected to the second pad 600, and the second pad 600 may be electrically connected to the external electrode 700 at the bottom of the base 100.

Similarly, to improve stability of mounting of the laser chip 200, in a more optional solution, the laser chip 200 may be electrically connected to the second pad 600 through a second conductive adhesive layer 210.

As mentioned above, the wire layer 310 is disposed on the optical element 300. Optionally, the wire layer 310 may be disposed on an outer surface of the optical element 300, or disposed on an inner side that is of the optical element 300 and that faces the bottom wall 111. To avoid harm of the wire layer 310 caused by collision in the mounting process of the laser projection module, in a more optional solution, the wire layer 310 is disposed on the inner surface that is of the optical element 300 and that faces the bottom wall 111. Certainly, the wire layer 310 may also be disposed inside the optical element 300.

The wire layer 310 may be a conductive layer coated on the surface of the optical element 300, or a conductive film pasted on the surface of the optical element 300. Some embodiments of the present disclosure do not limit a formation method of the optical element 300 as long as it is ensured that when the optical element 300 is cracked, the wire layer 310 is broken under cracking stress of the optical element 300.

Figure 5:
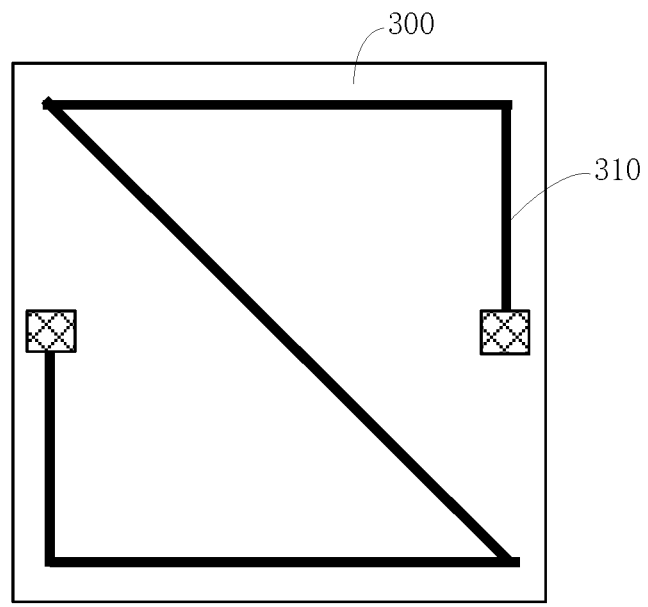
FIG. 5 and FIG. 6 are schematic diagrams of optical elements of two structures according to some embodiments of the present disclosure.
Figure 6:
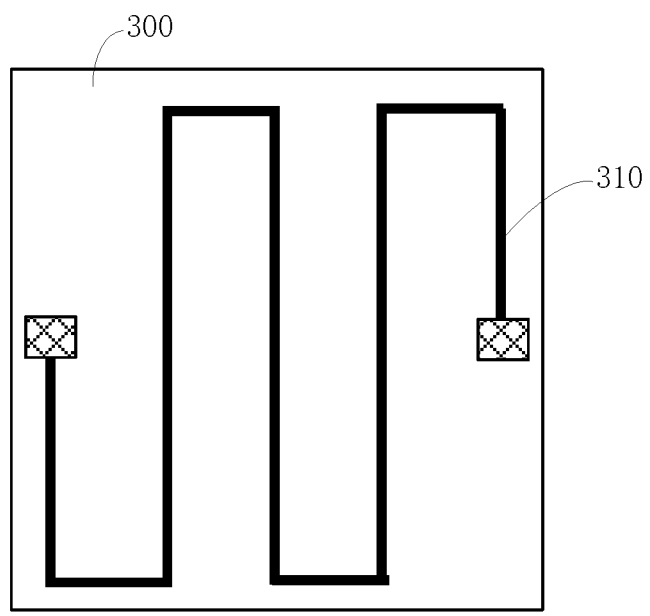

The wire layer 310 may have various shapes. As shown in FIG. 5 and FIG. 6, to better ensure that the wire layer 310 and the optical element 300 are broken synchronously, the wire layer 310 needs to cover the surface area of the optical element 300 as much as possible. Generally, the wire layer 310 may extend from one end of the optical element 300 to another end of the optical element 300 in a bending manner.

In the laser projection module disclosed in some embodiments of the present disclosure, the base 100 may be a ceramic base, a resin base, or the like, and some embodiments of the present disclosure do not limit a material of the base 100.

Based on the laser projection module disclosed in some embodiments of the present disclosure, some embodiments of the present disclosure disclose a terminal device. The disclosed terminal device includes the laser projection module described in the embodiments above.

The terminal device disclosed in some embodiments of the present disclosure may be a mobile phone, a tablet computer, an e-book reader, a game console, a wearable device (such as a smart watch), or the like. Some embodiments of the present disclosure do not limit a specific type of the terminal device.

The above embodiments of the present disclosure mainly describe the differences between various embodiments. As long as the different optimization features of the various embodiments are not contradictory, the various embodiments can be combined to form a better embodiment. Considering the brevity of the text, details are not described herein again.

The foregoing descriptions are merely embodiments of this disclosure, but are not intended to limit this disclosure. For a person skilled in the art, the present disclosure may have various changes and variations. Any modification, equivalent replacement, or improvement made without departing from the spirit and principle of this disclosure shall fall within the scope of claims of this disclosure.

What is claimed is:

1. A laser projection module, comprising a base, a laser chip, an optical element, and a first conducting wire, wherein the base has an inner cavity and an opening connected to the inner cavity, the laser chip is disposed on a bottom wall that is of the inner cavity and that faces the opening, the optical element is mounted in the opening, a wire layer is disposed on the optical element, and the laser chip, the first conducting wire, and the wire layer are sequentially connected in series; wherein
   the first conducting wire is a connection cable, and the first conducting wire is located in the inner cavity;
   the wire layer is disposed on an inner surface that is of the optical element and that faces the bottom wall; and
   the opening of the base has a step surface, and the optical element is fixedly bonded to the step surface, wherein a first pad is disposed on the step surface, and the wire layer is electrically connected to the first conducting wire through the first pad.

2. The laser projection module according to claim 1, wherein the first pad is fixedly bonded to the wire layer through a first adhesive connecting portion, and the first adhesive connecting portion is a first conductive adhesive layer.

3. The laser projection module according to claim 2, wherein the step surface is fixedly bonded to an edge of the optical element through a second adhesive connecting portion.

4. The laser projection module according to claim 1, wherein a second pad is disposed on the bottom wall, the laser chip is fixed on the second pad, and the laser chip is electrically connected to the second pad.

5. The laser projection module according to claim 4, wherein the laser chip is electrically connected to the second pad through a second conductive adhesive layer.

6. The laser projection module according to claim 1, wherein the wire layer extends from one end of the optical element to another end of the optical element in a bending manner.

7. A terminal device, comprising a laser projection module; wherein
   the laser projection module comprises a base, a laser chip, an optical element, and a first conducting wire, wherein the base has an inner cavity and an opening connected to the inner cavity, the laser chip is disposed on a bottom wall that is of the inner cavity and that faces the opening, the optical element is mounted in the opening, a wire layer is disposed on the optical element, and the laser chip, the first conducting wire, and the wire layer are sequentially connected in series; wherein
   the first conducting wire is a connection cable, and the first conducting wire is located in the inner cavity;
   the wire layer is disposed on an inner surface that is of the optical element and that faces the bottom wall; and
   the opening of the base has a step surface, and the optical element is fixedly bonded to the step surface, wherein a first pad is disposed on the step surface, and the wire layer is electrically connected to the first conducting wire through the first pad.

8. The terminal device according to claim 7, wherein the first pad is fixedly bonded to the wire layer through a first adhesive connecting portion, and the first adhesive connecting portion is a first conductive adhesive layer.

9. The terminal device according to claim 8, wherein the step surface is fixedly bonded to an edge of the optical element through a second adhesive connecting portion.

10. The terminal device according to claim 7, wherein a second pad is disposed on the bottom wall, the laser chip is fixed on the second pad, and the laser chip is electrically connected to the second pad.

11. The terminal device according to claim 10, wherein the laser chip is electrically connected to the second pad through a second conductive adhesive layer.

12. The terminal device according to claim 7, wherein the wire layer extends from one end of the optical element to another end of the optical element in a bending manner.

* * * * *